(12) United States Patent
Adusumilli et al.

(10) Patent No.: US 10,074,727 B2
(45) Date of Patent: Sep. 11, 2018

(54) LOW RESISTIVITY WRAP-AROUND CONTACTS

(71) Applicant: International Business Machines Corporation, Armonk, NY (US)

(72) Inventors: Praneet Adusumilli, Albany, NY (US); Adra V. Carr, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 15/280,226

(22) Filed: Sep. 29, 2016

(65) Prior Publication Data

US 2018/0090582 A1    Mar. 29, 2018

(51) Int. Cl.
| | | |
|---|---|---|
| *H01L 29/45* | (2006.01) |
| *H01L 29/08* | (2006.01) |
| *H01L 29/161* | (2006.01) |
| *H01L 21/8238* | (2006.01) |
| *H01L 21/285* | (2006.01) |
| *H01L 21/225* | (2006.01) |
| *H01L 29/06* | (2006.01) |
| *H01L 29/423* | (2006.01) |
| *H01L 29/78* | (2006.01) |
| *H01L 27/092* | (2006.01) |

(52) U.S. Cl.
CPC .......... *H01L 29/45* (2013.01); *H01L 21/2251* (2013.01); *H01L 21/28518* (2013.01); *H01L 21/823814* (2013.01); *H01L 21/823821* (2013.01); *H01L 27/0924* (2013.01); *H01L 29/0665* (2013.01); *H01L 29/0847* (2013.01); *H01L 29/161* (2013.01); *H01L 29/42392* (2013.01); *H01L 29/785* (2013.01); *H01L 2029/7858* (2013.01)

(58) Field of Classification Search
CPC ... H01L 29/45; H01L 21/2251; H01L 29/785; H01L 21/823821; H01L 29/42392; H01L 29/0665; H01L 27/0924; H01L 21/28518; H01L 21/823814; H01L 29/161; H01L 29/0847; H01L 2029/7858
USPC .................. 257/347, 368, 753, 369; 438/157
See application file for complete search history.

(56) References Cited

U.S. PATENT DOCUMENTS

| | | |
|---|---|---|
| 5,306,666 A | 4/1994 | Izumi |
| 6,099,904 A | 8/2000 | Mak et al. |
| 6,599,572 B2 | 7/2003 | Saanila et al. |

(Continued)

*Primary Examiner* — Bo Fan
(74) *Attorney, Agent, or Firm* — Daniel P. Morris, Esq.; Otterstedt, Ellenbogen & Kammer, LLP

(57) ABSTRACT

Low resistivity, wrap-around contact structures are provided in nanosheet devices, vertical FETs, and FinFETs. Such contact structures are obtained by delivering dopants to source/drain regions using a highly conformal, doped metal layer. The conformal, doped metal layer may be formed by ALD or CVD using a titanium tetraiodide precursor. Dopants within the conformal, doped metal layer are delivered during the formation of wrap-around metal silicide or metal germano-silicide regions. Dopant segregation at silicide/silicon interfaces or germano-silicide/silicon interfaces reduces contact resistance in the wrap-around contact structures. A contact metal layer electrically communicates with the wrap-around contact structures.

12 Claims, 5 Drawing Sheets

(56) References Cited

U.S. PATENT DOCUMENTS

| | | |
|---|---|---|
| 9,245,989 B2 | 1/2016 | Then et al. |
| 9,330,936 B2 | 5/2016 | Hasegawa et al. |
| 2009/0184369 A1* | 7/2009 | Zhu ................... B82Y 10/00 257/347 |
| 2014/0035041 A1 | 2/2014 | Pillarisetty |
| 2014/0209855 A1 | 7/2014 | Cea et al. |
| 2015/0123215 A1 | 5/2015 | Obradovic et al. |
| 2015/0132939 A1 | 5/2015 | Hasegawa et al. |
| 2015/0295084 A1* | 10/2015 | Obradovic .......... H01L 29/7845 257/347 |
| 2015/0325484 A1* | 11/2015 | Lin .................... H01L 21/3215 257/753 |
| 2015/0364542 A1 | 12/2015 | Rodder et al. |
| 2016/0126310 A1 | 5/2016 | Rodder et al. |
| 2016/0197075 A1* | 7/2016 | Li ...................... H01L 27/0924 257/369 |
| 2016/0211338 A1* | 7/2016 | Wang .............. H01L 21/823481 |

* cited by examiner

LOW RESISTIVITY WRAP-AROUND CONTACTS

BACKGROUND

The present disclosure relates generally to the electrical, electronic and computer arts and, more particularly, to wrap-around contacts for field-effect transistors (FETs) and their fabrication.

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

The contribution of middle-of-line (MOL) contact resistance to the total parasitic resistance is increasing due to aggressive dimensional scaling in advanced CMOS devices. Silicide/source-drain interface resistance can be a major contributor to the total external parasitic resistance. Increasing silicide contact length by wrapping around the total source-drain surface can reduce the overall contact resistance. Conformal metallization processes using chemical vapor deposition (CVD) or atomic layer deposition (ALD) are known to the art. The delivery of dopants to source-drain regions has been effected through the use of plasma-based doping techniques. It is challenging to deliver dopants uniformly around epitaxially formed source-drain structures using such techniques. Faceted, epitaxially grown source-drain structures are found in various field-effect transistor architectures including tri-gate FinFETs and nanosheet field-effect transistors.

Nanosheet FETs may include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs.

Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed following fin patterning. Gate-last procedures can involve making a dummy gate, fabricating other elements of the transistor such as the source/drain regions, removing the dummy gate, and replacing the removed dummy gate with actual gate materials.

Source/drain extension regions of FinFETs can be formed after the disposable gate structures have been completed. Such extension regions are grown epitaxially and comprise faceted structures. A planarization dielectric layer is deposited over the semiconductor substrate, the disposable gate structures, and the gate spacers. The planarization dielectric layer may include a dielectric material that can be planarized, for example, by chemical mechanical planarization (CMP). For example, the planarization dielectric layer can include a doped silicate glass, an undoped silicate glass (silicon oxide), and/or porous or non-porous organosilicate glass. The planarization dielectric layer is planarized above the topmost surfaces of the disposable gate structures.

The disposable gate structures are removed by at least one etch that is selective to the gate spacers and to the dielectric materials of the planarization dielectric layer. Cavities are formed from the spaces remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures. Replacement gate structures are ordinarily formed in the gate cavities. MOL processing includes the formation of source-drain contacts.

BRIEF SUMMARY

Techniques are provided for forming low resistivity wrap-around contacts for use in FETs such as nanosheet transistors, FinFETs and vertical transport FET devices.

In one aspect, an exemplary fabrication method includes obtaining a structure including a plurality of field-effect transistors, each field-effect transistor including faceted silicon or silicon germanium source/drain regions, depositing a conformal metal layer containing dopant atoms on the structure, and annealing the structure, thereby forming metal silicide or metal germano-silicide wrap-around contact layers and causing diffusion of the dopant atoms from the conformal metal layer into interface regions between the wrap-around contact layers and the faceted source/drain regions. A barrier layer is deposited on the structure and a metal contact layer is deposited on the structure and over the barrier layer such that the metal contact layer is in electrical communication with the wrap-around contact layers.

In another aspect, an exemplary monolithic structure includes a plurality of field-effect transistors, each field-effect transistor including faceted silicon or silicon germanium source/drain regions, and wrap-around contact structures integral with the source/drain regions. Each wrap-around contact structure includes a wrap-around metal silicide or germano-silicide layer and an adjoining wrap-around interface region, the interface region having a conformal, uniform diffusion doping profile.

Techniques as disclosed herein can provide substantial beneficial technical effects. By way of example only and without limitation, one or more embodiments may provide one or more of the following advantages:

Low source-drain contact resistance;
Uniform and targeted dopant delivery to silicide/source-drain interfacial regions;
Compatible with CMOS processing.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
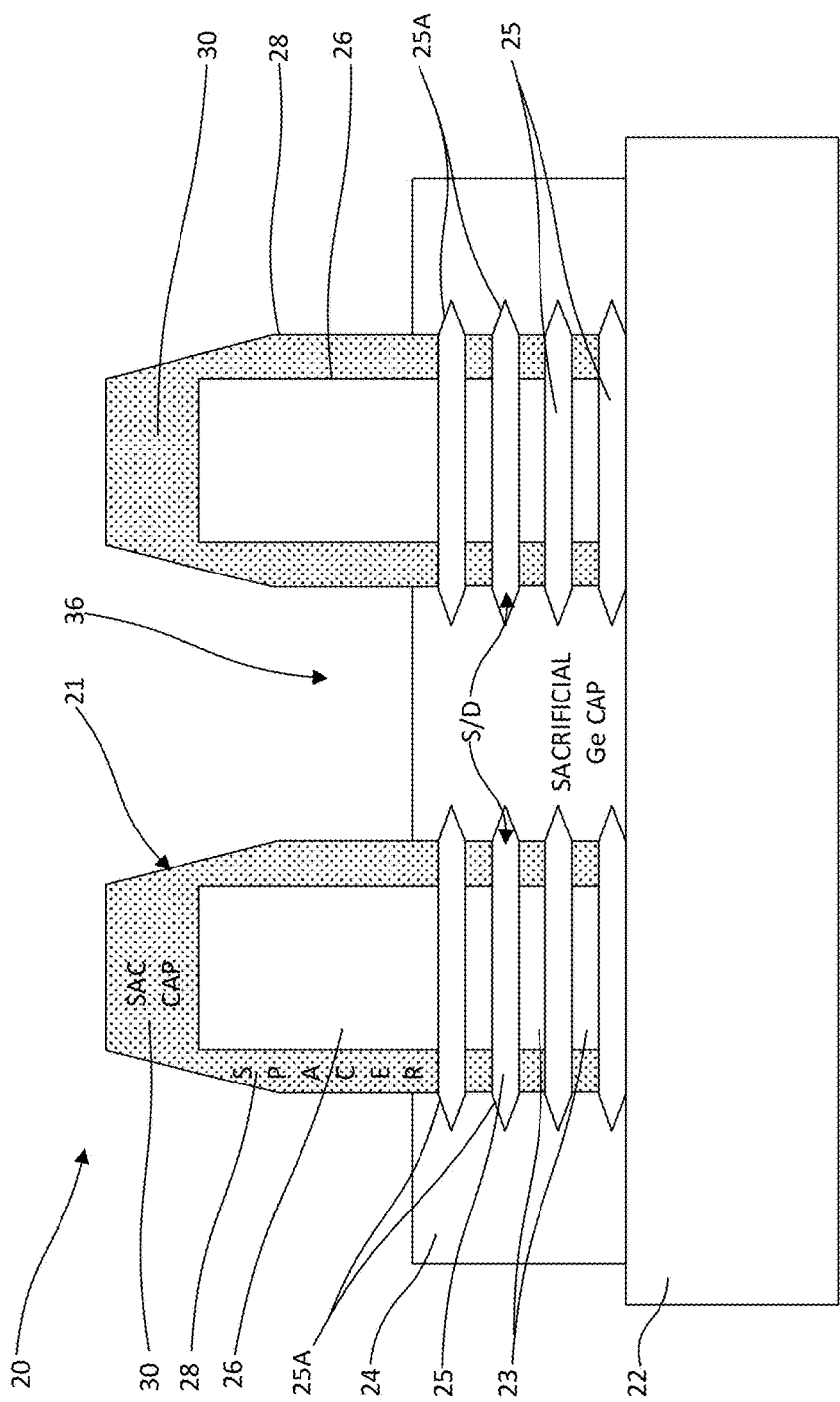
FIG. 1 is a schematic, cross-sectional view of a structure including nanosheet FETs and a sacrificial germanium layer formed over the source-drain regions of the FETs.

FIG. 1 schematically depicts an exemplary semiconductor structure 20 including nanosheet FETs 21 formed on a substrate 22. The substrate may be divided into nFET and pFET regions, in which case the nFET region includes nFETs and the pFET region includes pFETs. The nFETs include n-type source/drain regions, for example phosphorus-doped silicon regions. In embodiments wherein the structure 20 includes pFETS, the source/drain regions are p-type. The exemplary nanosheet FETs 21 are gate-all-around structures comprised of multiple nanosheet channel layers 25 with associated source/drain regions 25A. The channel layers 25 and source/drain regions are comprised of monocrystalline silicon or silicon germanium. The channels 25 and source/drain regions 25A may or may not have the same composition. The source/drain regions 25A are grown epitaxially on the exposed surfaces of the channel layers and form faceted structures as schematically illustrated. In-situ doping of the source/drain regions can be conducted using conventional precursor materials and techniques. Source/drain regions 25A consisting essentially of phosphorus-doped silicon is employed in an exemplary embodiment. Source/drain epitaxy to form p-doped source/drain regions may include the introduction of boron precursor gas such as diborane. The p-doped source/drain structures may consist essentially of boron-doped silicon germanium in one or more exemplary embodiments. In one exemplary embodiment where the doped source/drain semiconductor material is silicon germanium (SiGe) containing about thirty-five percent (35%) germanium, the dopant is boron in a concentration in the range of $4-9\times10^{20}$ $cm^{-3}$ and the resulting FinFET structure is p-type. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). In one or more exemplary embodiments, the channel layers 25 have a thickness in the range of four to ten nanometers (4-10 nm). The number of channel layers in each transistor 21 may vary depending on the desired uses and capabilities of the transistors.

Gate stack layers 23 adjoin each channel layer. A gate contact layer 26 (for example, W metallization) is also provided on the top surface of each nanosheet stack to form GAA structures having good electrostatic properties. The gate stack layers 23 each include a work function metal such as TiN, TaN, TiC, TiAlC, TiSiN, TaSiN, TaC or HfN and a dielectric layer such as $HfO_2$, $HfSiO_x$, SiON or other high-k composition. Spacers 28 and a cap layer 30 protect the gate during source/drain contact formation as described further below. The dielectric caps 30 prevent shorting between the metal gate and the subsequently formed self-aligned contacts. A silicon nitride ($Si_3N_4$) layer can be deposited via CVD, PECVD, sputtering, or other suitable technique to form the spacers 28. The spacers can include a single layer or be multi-layer. Spacer thickness is between two and ten nanometers (2-10 nm) in some embodiments. The spacers 28 can be formed by any method known in the art, including depositing a conformal nitride layer and removing unwanted material using an anisotropic etching process such as reactive ion etching or plasma etching. The cap layer 30 may also be a nitride layer.

A sacrificial germanium layer 24 is formed on the substrate 22 covers the source/drain regions 25A of the nanosheet FETs 21. The sacrificial layer 24 is essentially pure, undoped germanium in one or more embodiments and is grown in situ using a precursor such as germane ($GeH_4$) in an epitaxial process chamber. An electrically insulating (MOL) layer (not shown), for example silicon dioxide or a low-k dielectric such as SiOCH, can be formed on the structure 20 and above the germanium layer 24 using CVD or other known techniques. The electrically insulating layer may be planarized using chemical mechanical planarization (CMP), as known in the art. The layer is patterned using a photoresist layer (not shown) and etched (for example, a reactive ion etch) to form trenches 36 that extend down to the germanium layer 24. The MOL dielectric layer is removed only in areas where local interconnect structures are printed. The exemplary structure 20 shown in FIG. 1 is accordingly obtained.

Figure 2:
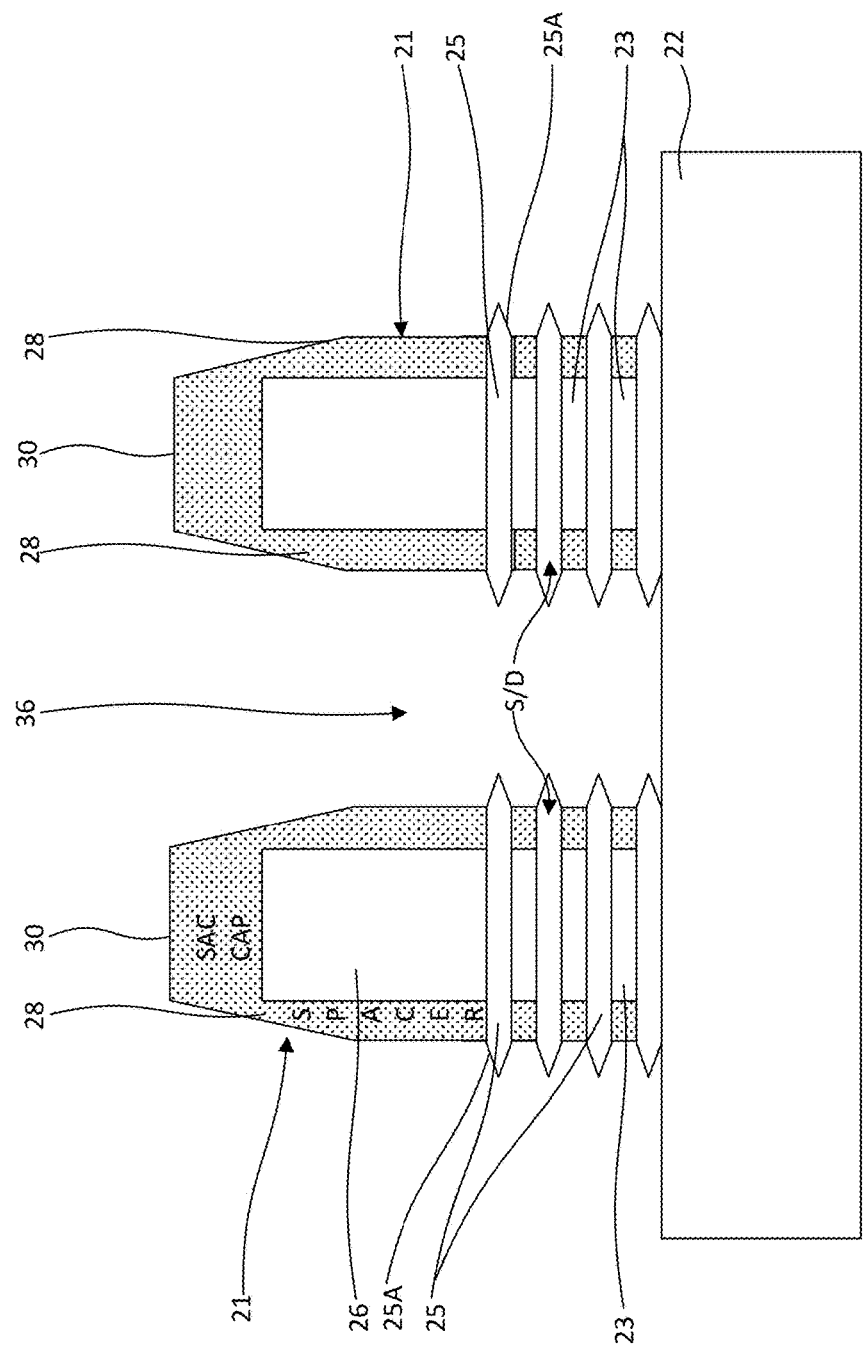
FIG. 2 is a schematic, cross-sectional view thereof following removal of the sacrificial germanium layer.

Referring to FIG. 2, the sacrificial germanium layer 24 is removed to expose the source/drain regions 25A. The use of germanium for the sacrificial layer 24 allows benign wet chemistries to be employed for selective germanium removal that leaves the other materials comprising the structure 20 intact. In structures including both nFET and pFET regions, a patterned soft mask covers, for example, the nFET region while leaving the pFET region exposed. The portion of the germanium layer in the pFET region is removed using, for example, hot water or hydrogen peroxide. Following deposition of a highly conformal, doped metal layer as described further below in the pFET region, the original soft mask is removed. A second patterned soft mask is employed to protect the pFET region while exposing the portion of the germanium layer 24 in the nFET region. Upon removal of the portion of the germanium layer in the nFET region, a highly conformal metal layer containing n-type dopants is deposited and the second soft mask is removed. Plasma ashing with a nitrogen/hydrogen gas combination may be employed to remove the soft masks. As discussed above, faceted surfaces make it difficult to deliver dopants uniformly and conformally to the source/drain regions of FETs having such epitaxially grown regions when using plasma-based doping techniques.

Figure 3:
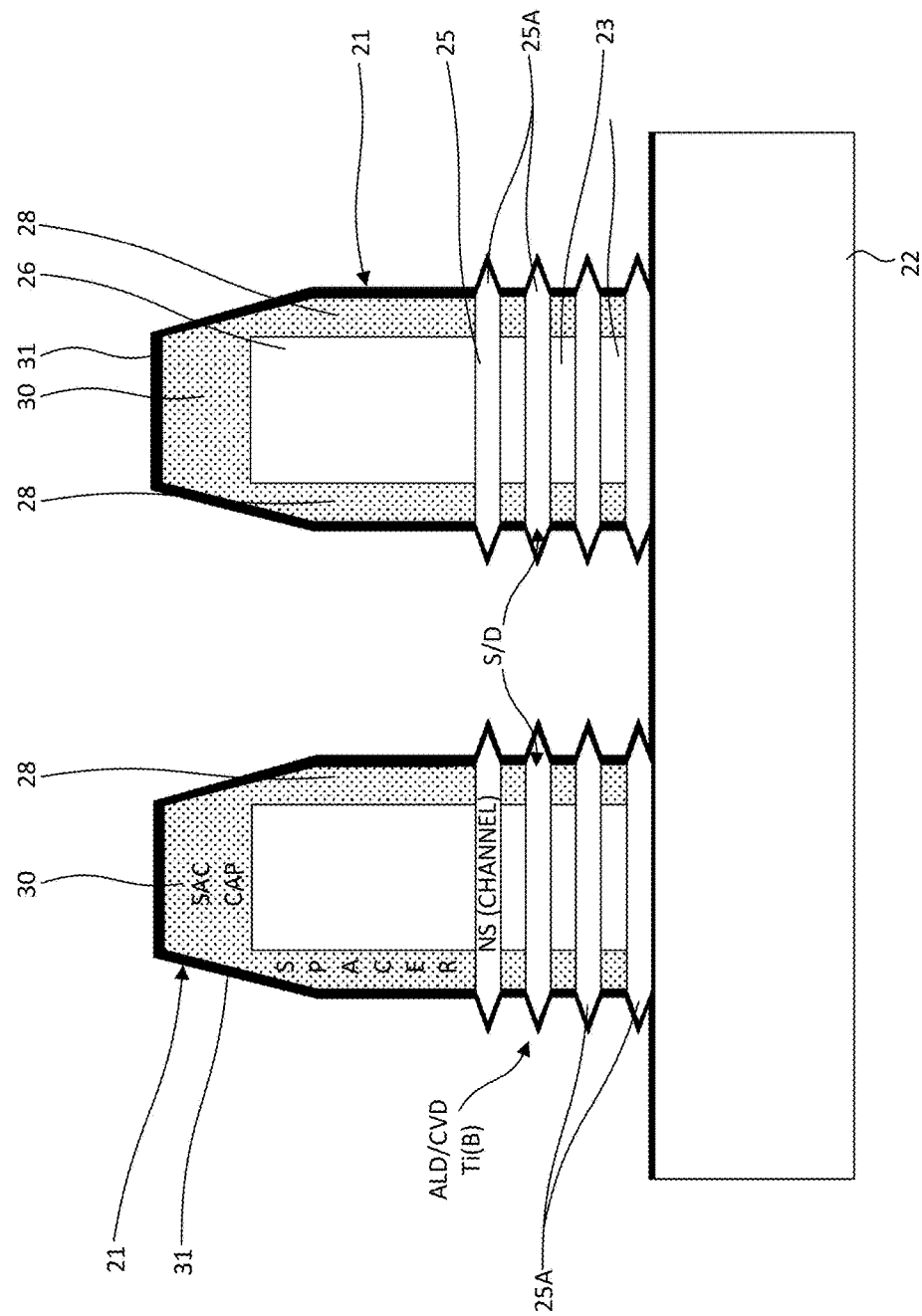
FIG. 3 is a schematic, cross-sectional view thereof following deposition of a conformal, doped titanium film.

FIG. 3 schematically illustrates the structure 20 including a highly conformal, doped titanium film 31 deposited thereon following removal of the sacrificial germanium layer. A conformal film is understood as having uniform thickness. Chemical vapor deposition (CVD) and atomic layer deposition (ALD) are among the techniques that are suitable for depositing the doped titanium film conformally. Titanium tetraiodide ($TiI_4$) and one of diborane ($B_2H_6$), phosphane ($PH_3$) and arsine ($AsH_3$) are employed in exemplary embodiments to form conformal Ti(B), Ti(P) or Ti(As) films on the structure, including the exposed source/drain regions 25A thereof. The doping of the titanium layer may or may not be uniform through its thickness. The ratios of titanium tetraiodide to the dopant gas employed depend on the dopant level needed in the particular device. In some embodiments, the doped titanium film 31 comprises a graded film stack including different dopant concentrations that are provided by adjusting the ratio of the precursor gases employed. In another embodiment, a multilayer film stack includes a pure titanium layer in addition to one or more doped titanium layers. The doped titanium film 31 has a thickness of thirty to eighty Angstroms (30-80 Å) in some exemplary embodiments. A graded dopant concentration may be useful in cases where it is desired to engineer a maximum dopant concentration close to a subsequently formed silicide/silicon interface of the source/drain regions. The deposition of the conformal metal film 31 is followed by the ALD deposition of a titanium nitride layer (not shown). Possible alternatives for titanium include tantalum, hafnium, zirconium and niobium, all of which can be introduced as tetraiodide compounds. Silicides of these metals have low sheet resistivity and are good candidates for source-drain contacts.

Figure 4:
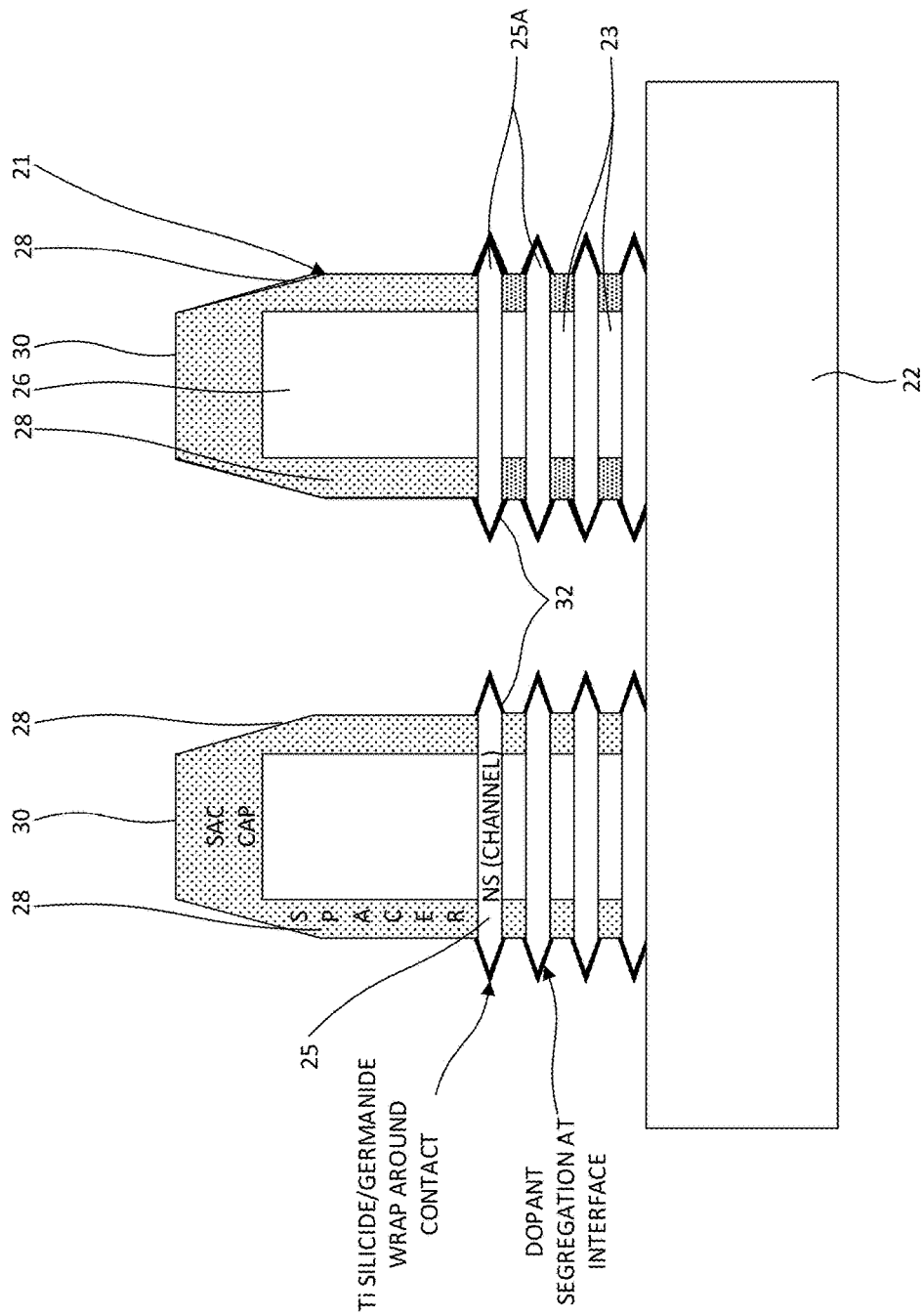
FIG. 4 is a schematic, cross-sectional view thereof following silicide or germano-silicide formation and selective stripping of unreacted metal.

The structure is subjected to annealing to form a titanium silicide or germane-silicide wrap-around contact layer 32 on the source/drain regions 25A. Rapid thermal anneal (RTA) and laser anneal may be employed for the annealing step. The thermal budget is sufficient for diffusion and segregation of the dopant atoms at the silicide/silicon interface in embodiments wherein the source/drain regions consist essentially of monocrystalline silicon. The term "segregation" refers to the 'pile-up' of dopants at the interface between silicide and source/drain epitaxy, also described herein as the silicide/silicon interface with respect to some embodiments. Interfaces typically include a large number of defects; dopants and other impurities tend to travel to and pile-up at these sites. Dopant segregation is thermodynamically favored since it reduces the total energy of the system. Unreacted titanium/titanium nitride is selectively removed from the structure following the post-silicidation anneal, leaving the dielectric surfaces (e.g. the spacers 28 and cap 30) exposed and titanium-based silicide layers (and/or titanium-based germano-silicide layers) 32 on the source/drain regions 25A. The selective removal of titanium-based materials from surfaces other than the silicide layers 32 may be conducted by a wet process using, for example, sulfuric peroxide mixture (SPM), which combines the use of sulfuric acid and hydrogen peroxide. In some exemplary structures including both nFET and pFET regions, annealing causes the source/drain regions within the nFET region to include $TiS_2$ layers while titanium germano-silicide ($Ti(SiGe)_2$) layers are formed on the source/drain regions in the pFET region. Boron atoms are delivered to the $Ti(SiGe)_2$/SiGe interfaces and phosphorus atoms are delivered to the $TiS_2$/Si interface regions of the source/drain regions in some exemplary embodiments, thereby reducing contact resistance in the wrap-around contact structures. An exemplary structure as shown in FIG. 4 is accordingly obtained. The process allows dopants to be delivered uniformly and conformally. Specifically, the dopant concentration decreases in the perpendicular direction (towards each epitaxial source/drain region) within the silicide/silicon interfacial region in embodiments including silicon source/drain regions while the dopant diffusion profile is essentially the same in the direction parallel to the interfacial region along the entirety of the silicide layer. Accordingly, the dopant diffusion profile within the interfacial regions are essentially the same regardless of whether the faceted surfaces of the source/drain regions face upwardly or downwardly. It will be appreciated that the $TiS_2$ or $Ti(SiGe)_2$ layer formed on the source/drain regions by annealing will, in addition to the heterophase interface region, include dopant atoms. Depending on the doping concentration(s) of the doped conformal titanium layer from which they are, in part, formed, the $TiS_2$ or $Ti(SiGe)_2$ layer may have a graded dopant concentration. The portion of the $TiS_2$ or $Ti(SiGe)_2$ layer adjoining the heterophase interface has a relatively high dopant concentration in some embodiments compared to the portion of the layer that is remote from this interface.

Figure 5:
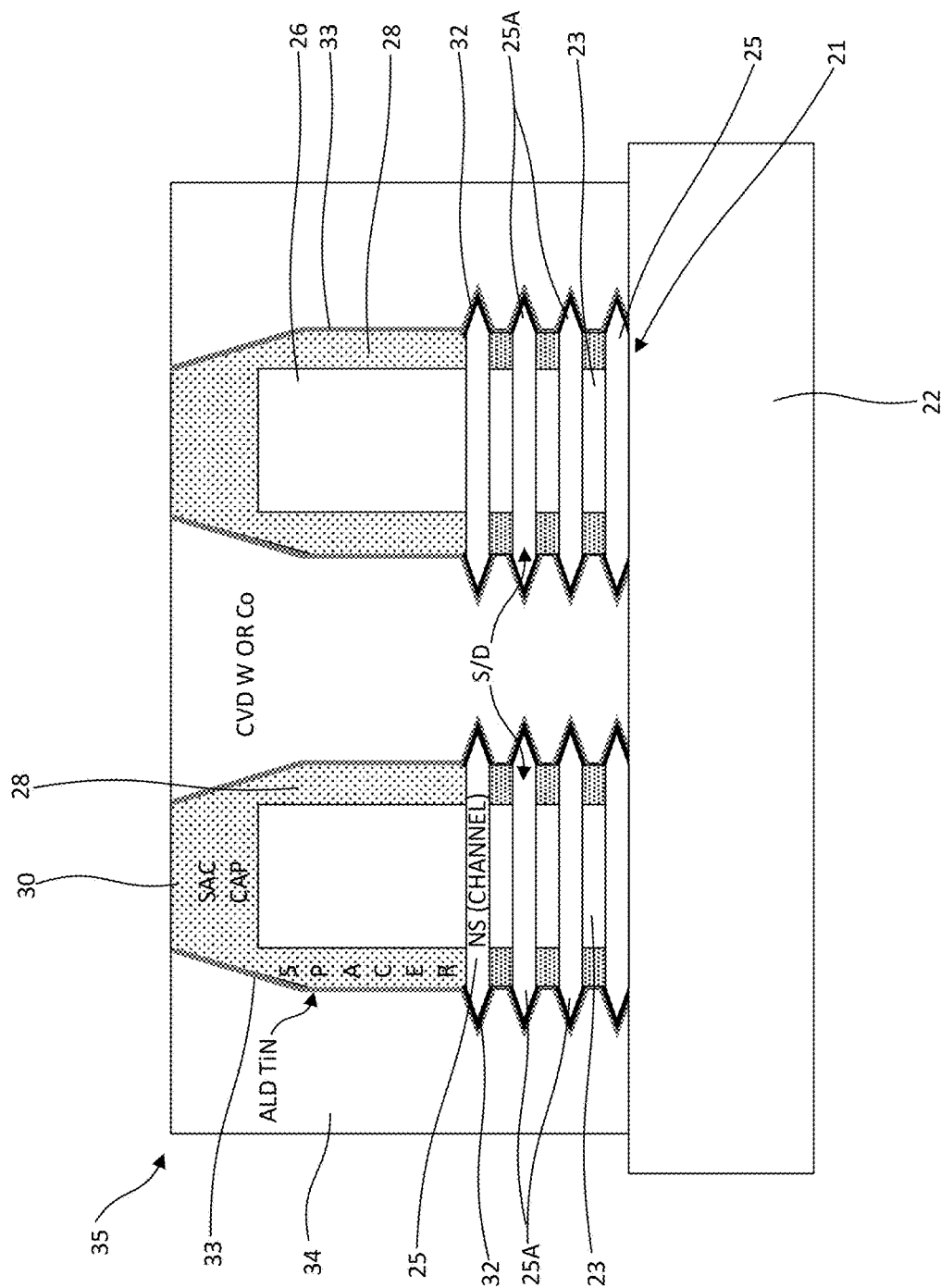
FIG. 5 is a schematic, cross-sectional view thereof following deposition of a barrier layer and contact metallization.

A conformal barrier layer 33 is formed on the structure 35 as schematically illustrated in FIG. 5. The barrier layer is a titanium nitride (TiN) layer in some embodiments. The TiN layer may have a thickness of about ten to forty Angstroms (10-40 Å) in embodiments wherein tungsten metallization is later employed. A TiN barrier layer can be deposited using any suitable deposition process, for example, atomic layer deposition. The titanium nitride layer forms a liner on the wrap-around contacts 32, the spacers 28, and other elements of the structure 35, as shown in FIG. 5. Bilayer liners including TiN and tungsten nitride (WN) may be employed in alternative embodiments.

A contact metal layer 34 is deposited on the structure and directly contacts the barrier layer 33. In some embodiments, the contact metal layer 34 is a tungsten (W) layer that is deposited using a tungsten hexafluoride source with silane. Chemical vapor deposition conducted between 300-400° C. using tungsten hexafluoride precursor chemistry may, for example, be employed to deposit a tungsten layer. Plasma enhanced CVD, thermal CVD, and atomic layer deposition are other possible options for depositing a conformal tungsten layer. It will be appreciated that other low resistivity materials may be employed as contact metals in alternative embodiments. Such materials include aluminum, cobalt, nickel, molybdenum, ruthenium, iridium, rhodium, osmium and their alloys. Halide-based or metal-organic precursors may be employed to form conformal layers using one or more of the materials. Cobalt may, for example, be deposited using a metal-organic precursor in a CVD process at a temperature range of 150-200° C. Ruthenium may be deposited using thermal CVD at 1.5 Torr and at a process temperature of 250-350° C. In one exemplary embodiment, a ruthenium layer is deposited using PECVD at a processing temperature in the range of 250-350° C. at 1.5 Torr with 400-600 W plasma power until a layer between 0.5-2.0 nm is formed. The thickness of the metal contact layer should be sufficient to ensure the absence of discontinuities in the layer formed on the dielectric surfaces during a first deposition stage in embodiments where multiple deposition stages are employed. Following completion of the first stage, which in some embodiments includes multiple plasma-enhanced deposition steps, the second stage includes the thermal chemical vapor deposition (CVD) of contact metal. In one exemplary embodiment, ruthenium is deposited for 25-275 seconds at 1.5 Torr and at a process temperature of 250-350° C. The PECVD process provides good nucleation while thermal CVD provides improved contact metal coverage on the trench sidewalls as compared to PECVD. Excess metal contact material (overburden) is removed by chemical mechanical planarization (CMP).

While the fabrication process has been described with respect to forming low resistivity contacts in nanosheet transistors, those of skill in the art will appreciate that it can also be applied to other types of field-effect transistors, including vertical FETs and tri-gate FinFETs. In one alternative embodiments wherein the nFETs and/or pFETs are tri-gate FinFETs, expanded source/drain regions can be grown epitaxially on exposed portions of semiconductor fins. Doped silicon or silicon germanium grown epitaxially on the sidewalls (110 surfaces) of silicon fins increases the volumes of the source/drain regions thereof. Either p-type devices or n-type devices can be fabricated depending on the conductivity types of the epitaxial source/drain regions, as known in the art. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorus. In embodiments where n-type FinFET devices are to be formed, in-situ n-doped silicon may be used to form the epitaxial source/drain regions. In-situ doping of the source/drain regions can be conducted using conventional precursor materials and techniques. Source/drain regions consisting essentially of phosphorus-doped silicon is employed in an exemplary embodiment. Source/drain epitaxy to form p-doped source/drain regions may include the introduction of boron precursor gas such as diborane. The p-doped source/drain structures may consist essentially of boron-doped silicon germanium in one or more exemplary embodiments. In one exemplary embodiment where the doped source/drain semiconductor material is silicon germanium (SiGe) containing about thirty-five percent (35%) germanium, the dopant is boron in a concentration in the range of $4-9\times10^{20}$ cm$^{-3}$ and the resulting FinFET structure is p-type. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C. Fin sidewall surfaces are (110) surfaces in one or more embodiments such that epitaxial growth thereon produces in diamond-shaped (faceted) structures due to the fact that the growth rate on (111) planes is considerably less than on (110) planes. Self-limiting diamond-shaped structures can accordingly be formed. Growth may be limited to avoid merging of the faceted source/drain regions. It will be appreciated that doped source/drain regions can be formed using other known methods including but not limited to implantation and diffusion doping techniques. The process substantially as described above with reference to FIGS. 1-5 can be applied to form low resistivity, wrap-around contacts on faceted source/drain regions during the fabrication of tri-gate FinFETs. Metal contacts electrically communicating with the silicide regions are formed on the source/drain regions of the FinFETs. Self-aligned contacts facilitate alignment during fabrication of integrated circuit devices having small dimensions. Tungsten and cobalt are two exemplary metal contact materials that can be deposited using the same techniques described above with respect to the nanosheet transistors.

FIGS. 1-5, as discussed above, depict exemplary processing steps/stages in the fabrication an exemplary structure. Although the overall fabrication method and the structure formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary fabrication method includes obtaining a structure including a plurality of field-effect transistors 21, each field-effect transistor including faceted silicon or silicon germanium source/drain regions 25A. An exemplary structure is shown in FIG. 2. A conformal metal layer 31 containing dopant atoms is deposited on the structure. The structure is annealed, thereby forming metal silicide or metal germane-silicide wrap-around contact layers 32 (e.g. TiS$_2$ or Ti(SiGe)$_2$) and causing diffusion of the dopant atoms from the conformal metal layer into interface regions between the wrap-around contact layers 32 and the faceted source/drain regions 25A. A barrier layer 33 is deposited on the structure followed by the deposition of a metal contact layer 34, the metal contact layer being in electrical communication with the wrap-around contact layers. In some embodiments, the structure 20 further includes a germanium layer 24 covering the source/drain regions, and the fabrication method further includes selectively removing the germanium layer to expose the source/drain regions prior to depositing the conformal metal layer 31. The conformal metal layer consists essentially of titanium in one or more embodiments. The dopants contained in the conformal titanium layer may include boron, arsenic or phosphorus atoms depending on whether the field-effect transistors are nFETs or pFETs. Depositing the conformal titanium layer includes introducing titanium tetraiodide and a precursor gas including the dopant atoms into a process chamber, and forming the conformal titanium layer using chemical vapor deposition or atomic layer deposition. The precursor gas may consist essentially of diborane, phosphane or arsine. The fabrication method further includes selectively removing an unreacted portion of the conformal metal layer (for example a conformal Ti layer and an ALD TiN layer on the Ti layer) following the forming of the metal silicide or metal germano-silicide wrap-around contact layers. The fabrication method facilitates causing diffusion of the dopant atoms uniformly and conformally in the interface regions. The interface regions will accordingly have a higher doping concentration than the remainder of the source/drain regions and, with the metal silicide (or metal germane-silicide) layer, form a low resistivity wrap-around contact structure on each faceted source/drain region.

A monolithic structure 35 is further provided that includes a plurality of field-effect transistors, each field-effect transistor including faceted silicon or silicon germanium source/drain regions. Wrap-around contact structures integral with the source/drain regions include a wrap-around metal silicide or germane-silicide layer 32 and an adjoining wrap-around interface region, the interface region having a conformal, uniform diffusion doping profile. The monolithic structure may further including a contact metal layer 34 electrically communicating with the wrap-around contact structures. The metal silicide or metal germane-silicide layer comprises $TiS_2$ or $Ti(SiGe)_2$ in some embodiments. The contact metal layer 34 directly contacts a barrier layer 33 in the exemplary embodiments. In some embodiments, each of the field-effect transistors 21 includes a stack of nanosheet channel layers 25, the source/drain regions 25A extending from the channel layers. The metal silicide or metal germane-silicide layer may include a graded dopant concentration. In embodiments wherein the silicide or germano-silicide layer has a graded dopant concentration, the dopant concentration may be greater near the interface than elsewhere within the layer. The outer portion of the silicide or germano-silicide layer includes no dopants at all in some embodiments.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FET devices and contacts formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure.

This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A fabrication method comprising:
   obtaining a structure including a plurality of field-effect transistors, each field-effect transistor including faceted silicon or silicon germanium source/drain regions;
   depositing a conformal metal layer containing dopant atoms on the structure;
   annealing the structure, thereby forming metal silicide or metal germano-silicide wrap-around contact layers and causing diffusion of the dopant atoms from the conformal metal layer into interface regions between the wrap-around contact layers and the faceted source/drain regions;
   depositing a barrier layer on the structure, and
   depositing a metal contact layer on the structure and over the barrier layer such that the metal contact layer is in electrical communication with the wrap-around contact layers.

2. The method of claim 1, wherein the structure further includes a germanium layer covering the source/drain regions, further including selectively removing the germanium layer to expose the source/drain regions prior to depositing the conformal metal layer.

3. The method of claim 1, wherein the conformal metal layer consists essentially of titanium.

4. The method of claim 3, wherein depositing the conformal metal layer includes:
   introducing titanium tetraiodide and a precursor gas including the dopant atoms into a process chamber, and
   forming the conformal metal layer using chemical vapor deposition or atomic layer deposition.

5. The method of claim 4, wherein the precursor gas consists essentially of diborane, phosphane or arsine.

6. The method of claim 3, further including:
   selectively removing an unreacted portion of the conformal metal layer following the forming of the metal silicide or metal germano-silicide wrap-around contact layers, and
   wherein causing diffusion of the dopant atoms further includes diffusing the dopant atoms uniformly and conformally in the interface regions.

7. The method of claim 3, wherein each of the field-effect transistors includes a stack of nanosheet channel layers, the source/drain regions extending from the channel layers.

8. The method of claim 3, wherein depositing the conformal metal layer further includes:
   depositing a first conformal titanium sublayer on the structure having a first doping concentration, and
   depositing a second conformal titanium sublayer having a second doping concentration on the first conformal titanium sublayer, the first doping concentration being different from the second doping concentration.

9. The method of claim 3, wherein depositing the conformal metal layer further includes:
   depositing a first conformal titanium sublayer having a first doping concentration, and
   depositing an undoped second conformal titanium sublayer on the first conformal titanium layer, the first and second conformal titanium sublayers being deposited by:
   introducing titanium tetraiodide and a precursor gas including the dopant atoms into a process chamber, and
   forming the first and second conformal titanium layers using chemical vapor deposition or atomic layer deposition.

10. The method of claim 3, wherein the field-effect transistors include gate-all-around structures.

11. The method of claim 3, wherein the field-effect transistors include tri-gate FinFETs.

12. The method of claim 1, wherein the field-effect transistors include vertical transport devices and the conformal metal layer consists essentially of titanium formed by:
   introducing titanium tetraiodide and a precursor gas including the dopant atoms into a process chamber, and
   forming the conformal metal layer using chemical vapor deposition or atomic layer deposition.

* * * * *